United States Patent
Takemoto et al.

(10) Patent No.: US 8,052,880 B2
(45) Date of Patent: Nov. 8, 2011

(54) METHOD FOR MANUFACTURING LIGHT REFLECTING METAL WALL

(75) Inventors: Masashi Takemoto, Mihara (JP); Syuji Takahashi, Sakai (JP); Tomio Wakamatsu, Sakai (JP); Yoshiteru Ogawa, Sakai (JP)

(73) Assignees: Sharp Kabushiki Kaisha, Osaka-shi (JP); Fuji Machinery Mfg. & Electronics Co., Ltd., Sakai-shi (JP)

( * ) Notice: Subject to any disclaimer, the term of this patent is extended or adjusted under 35 U.S.C. 154(b) by 846 days.

(21) Appl. No.: 12/121,030

(22) Filed: May 15, 2008

(65) Prior Publication Data
US 2008/0283492 A1 Nov. 20, 2008

(30) Foreign Application Priority Data
May 17, 2007 (JP) .................................. 2007-132188

(51) Int. Cl.
*C25F 5/00* (2006.01)

(52) U.S. Cl. .................. 216/4; 29/853; 438/29; 216/24; 216/52

(58) Field of Classification Search .......................... None
See application file for complete search history.

(56) References Cited

U.S. PATENT DOCUMENTS

| | | | |
|---|---|---|---|
| 5,610,473 A * | 3/1997 | Yokota et al. ................. | 313/402 |
| 6,213,836 B1 * | 4/2001 | Nagata et al. .................... | 445/23 |
| 6,559,583 B1 * | 5/2003 | Kanayama et al. ........... | 313/402 |
| 2006/0203333 A1 * | 9/2006 | Yamashita et al. ............ | 359/456 |
| 2009/0194783 A1 * | 8/2009 | Takemoto et al. ............ | 257/98 |
| 2010/0045846 A1 * | 2/2010 | Nishizawa et al. ........... | 348/340 |
| 2010/0053498 A1 * | 3/2010 | Takemoto et al. .............. | 349/61 |

FOREIGN PATENT DOCUMENTS

| | | |
|---|---|---|
| JP | 2004-282004 A | 10/2004 |
| JP | 2005-167086 A | 6/2005 |

* cited by examiner

*Primary Examiner* — Allan Olsen
(74) *Attorney, Agent, or Firm* — Morrison & Foerster LLP

(57) ABSTRACT

A method for manufacturing a light reflecting metal wall including a step (a) forming a cavity structure on a metal plate on which back surface a substrate is laminated, the cavity structure including on its side wall a light reflecting wall, the step (a) including the steps of (b) forming a first mask on a surface of the metal plate, the first mask having a mask opening portion corresponding to an opening portion of the cavity structure, and (c) forming the light reflecting wall on a side wall of the metal plate by carrying out wet etching with respect to the metal plate with the first mask, in the step (c), in the middle of the wet etching, the first mask being bent by press working along the light reflecting wall formed by the wet etching. As a result, the light reflecting metal wall is stably formed by securing both (i) an area of an LED chip mounting surface and (ii) a thickness of the light reflecting metal wall even if a packaged light-emitting element has a narrow lateral width of its short side.

11 Claims, 14 Drawing Sheets

FIG. 6(a)
FIG. 6(b)
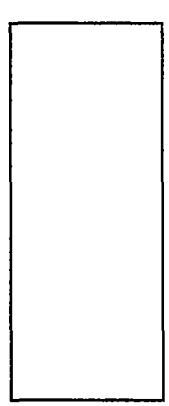
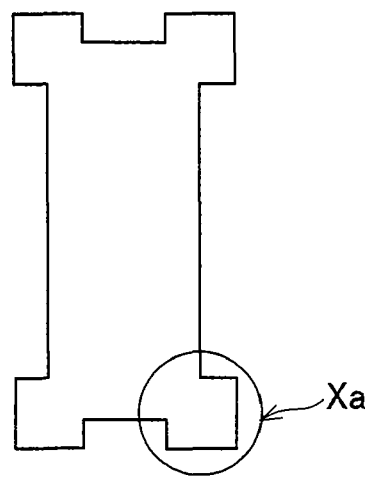
FIG. 7
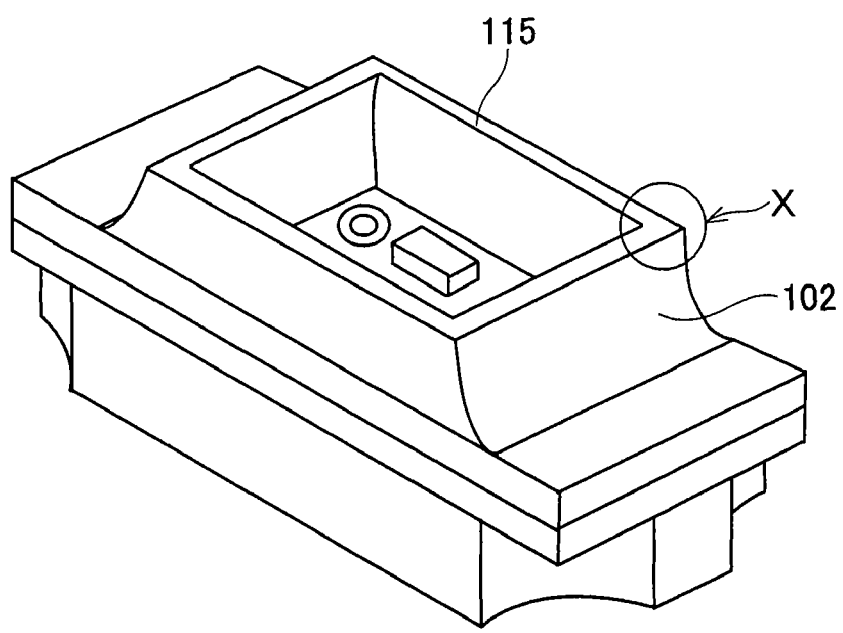

US 8,052,880 B2

METHOD FOR MANUFACTURING LIGHT REFLECTING METAL WALL

This Nonprovisional application claims priority under U.S.C. §119(a) on Patent Application No. 132188/2007 filed in Japan on May 17, 2007, the entire contents of which are hereby incorporated by reference.

FIELD OF THE INVENTION

The present invention relates to a method for manufacturing a light reflecting metal wall of a light-emitting element which is suitable for irradiating a thin display body, such as a liquid crystal panel, from a side of the display body.

BACKGROUND OF THE INVENTION

Conventionally, a light-emitting element such as a Light Emitting Diode (hereinafter, referred to as LED) is used as a light source of a backlight for irradiating a display panel, such as a liquid crystal display panel, from a side of the display panel. Light-emitting elements adopting various arrangements have been proposed so that light emitted from the LED is efficiently taken out from the light-emitting elements.

For example, FIGS. 10(a) and 10(b) illustrates a light-emitting element disclosed in Japanese Unexamined Patent Application Publication No. 2004-282004 (published on Oct. 7, 2004) (Publicly Known Document 1).

FIG. 10(a) is a plan view illustrating a conventional light-emitting element, and FIG. 10(b) is a cross-section view taken along the line I-I in FIG. 10(a).

As illustrated in FIGS. 10(a) and 10(b), the conventional light-emitting element includes an LED 501, a first electrode 503 formed on a substrate 505, a second electrode 504 formed so as to be away from the first electrode 503, and a light reflecting metal body 502 for reflecting light emitted from the LED 501.

The light reflecting metal body 502 has a light reflecting plane 502a, which is formed by etching around a position where the LED 501 is to be provided, and also is stacked integrally with the substrate 505. Further, translucent resin such as a translucent resin lens 506 is provided so that an outer circumferential rim of its convex plane is located at a top rim of the light reflecting plane 502a of the light reflecting metal body 502. This causes a surface on which the LED 501 is mounted is coated with the translucent resin lens 506.

Note that the light reflecting metal body 502 is preferable arranged to efficiently emit the light emitted from a light-emitting plane of the LED 501, via the translucent resin lens 506. The following description deals with how to form the light reflecting metal body 502 in a method for manufacturing this conventional light-emitting element.

FIG. 11(a) illustrates a state, in a step for manufacturing the conventional light-emitting element, where the light reflecting metal body 502 has been not formed yet. FIG. 11(b) illustrates a state, in the step for manufacturing the conventional light-emitting element, where the light reflecting metal body 502 has been already formed.

As illustrated in FIG. 11(a), a mask layer 511 is formed on a metal layer 512 such that at least a region where the LED 501 is to be provided is opened. Thereafter, as illustrated in FIG. 11(b), the light reflecting plane 502a is formed by selectively etching the metal layer 512. At this point, a shape of the light reflecting plane 502a is controlled by adjusting an etching level, so as to have a curved surface. This allows the light to be efficiently reflected from the side surface of the light reflecting metal body 502.

Meanwhile, the method for manufacturing the light reflecting metal body 502 is also applied to a method for manufacturing other components. For example, Japanese Unexamined Patent Application Publication No. 2005-167086 (published on Jun. 23, 2005) (Publicly Known Document 2) discloses an arrangement in which, by using a method similar to the aforementioned method, a convex metal portion is formed on an LED mounting substrate.

FIG. 12 is a cross-section view illustrating a conventional LED mounting substrate.

The conventional LED mounting substrate, as illustrated in FIG. 12, includes a convex metal portion 603 formed in a region where an LED 601 is to be mounted via a heat radiating pattern 602b. With this arrangement, heat created at the LED 601 is led to a metal substrate 604 via the heat radiating pattern 602b and the convex metal portion 603. This improves a heat radiation effect. Further, the LED 601 is electrically connected with an electrode section 602a, and a light reflecting body 605 is formed on a surface of the electrode section 602a so as to surround the LED 601.

As in the aforementioned method, the convex metal portion 603 is formed by (i) forming a metal layer on a metal substrate 604, (ii) forming an etching resist on a surface of the metal layer, and then (iii) etching the surface of the metal layer selectively.

Meanwhile, the light-emitting element, including a light reflecting surface formed by carrying out wet etching with respect to a metal plate, is not manufactured individually. Instead, a plurality of light-emitting elements are arranged at a prescribed interval and simultaneously manufactured in a single metal plate, and ultimately cut with a blade (a cutter) into light-emitting elements, individually.

FIG. 13(a) is a cross-section view illustrating the light-emitting element that has not been cut into light-emitting elements individually, as viewed from a side surface along a short side thereof. FIG. 13(b) is a plan view illustrating a state where a mask member 705 is detached from the light-emitting element of FIG. 13(a). FIG. 13(c) is a plan view illustrating a state where the mask member 705 is attached to the light-emitting element of FIG. 13(a). Additionally, only the two light-emitting elements are illustrated in FIGS. 13(a) to 13(c) for convenience.

The light-emitting element illustrated in FIGS. 13(a) to 13(c) includes a Cu wiring layer 701, a resin layer 702, an etch stop layer 703, a light reflecting metal wall 704 having a light reflecting surface 704a, and a mask member 705 which is made of metal. In such a light-emitting element, it is necessary to form the light reflecting plane 704a by carrying out wet etching with respect to the metal plate under three conditions described below.

Condition A
An LED chip mounting surface 706 should be made flat and wide.
Condition B
A thickness B of the light reflecting metal wall 704 should be made as thick as possible, the thickness B being in a direction parallel to the LED chip mounting surface 706.
Condition C
A height C of the light reflecting metal wall 704 should be higher than a desired height, the height C being in a direction perpendicular to the LED chip mounting surface 706.

The following describes CONDITION A. In a case where the LED chip is provided and is subjected to a conductive connection by wire bonding, there is a need to secure an area for industrial tools. Therefore, on the LED chip mounting surface 706, a minimum required width A needs to be secured and widened. Further, the LED chip mounting surface 706 needs to be flat so that the LED chip is suitably mounted.

The following describes the CONDITION B. By cutting a part with a blade, the part indicated by an arrow X, the light-emitting elements is prepared individually. Therefore, when the light reflecting metal wall 704 has a thin thickness B, there is a possibility that the light reflecting metal wall 704 is damaged during the cutting. Further, in cases where the light-emitting element is the one obtained by being individually cut, when the light reflecting metal wall 704 has a thin thickness t, this also causes some problem in view of an end product. As such, the thickness B of the light reflecting metal wall 704 needs to be made as thick as possible by taking into consideration a width P of the blade used in the cutting.

The following further describes the CONDITION C with reference to FIGS. 14(*a*) and 14(*b*). FIGS. 14(*a*) and 14(*b*) are diagrams explaining the height C of the light reflecting metal wall 704.

As illustrated in FIGS. 14(*a*) and 14(*b*), the light-emitting element has an arrangement in which sealing resin 709 is filled in an inner circumferential space, where the light reflecting surface 704*a* of the light reflecting metal wall 704 is formed, so that an exposed surface of the sealing resin 709 and the top surface of the light reflecting metal wall 704 form a single surface. This causes the sealing resin 709 to cover an LED chip 707 and a wiring 708. Thus, an area in which the sealing resin 709 is provided is determined in accordance with the height C of the light reflecting metal wall 704. As a result, it is necessary to determine the height C of the light reflecting metal wall 704 in accordance with a positional relationship causing the LED chip 707 and the wiring 708 not to protrude from the sealing resin 709.

Further, in a case where the light reflecting metal wall 704 has a low height C as illustrated in FIG. 14(*a*), a directivity angle α (an angle at which the light emits) becomes wider than a case where the light reflecting metal wall 704 has a high height C as illustrated in FIG. 14(*b*). It is not preferable to make the directivity angle α too wide, because if the directivity angle α is wide, then loss of light will increase. As such, it is necessary to set the height C of the light reflecting metal wall 704 to be higher than a desired height, by taking into consideration (i) the positional relationship causing the LED chip 707 and the wiring 708 not to protrude from the sealing resin 709 and (ii) the setting of the directivity angle α.

It is desirable to meet the aforementioned three conditions. However, as described in Public Known Documents 1 and 2, according to the conventional method, the metal plate is protected with the mask member and wet etching is carried out with respect to the metal plate. It is difficult to form a required shape of the opening portion of the light reflecting surface, because metal is a material which is etched isotropically.

For example, as illustrated in FIG. 15, it is assumed that the height C of the light reflecting metal wall 704 (a distance from the etch stop layer 703 to the opening portion) is set to be longer than a lateral width W of a packaged light-emitting element. In this case, since etching is performed isotropically, the etching is carried out up to an area of the LED chip mounting surface in a lateral direction of the opening portion but the etching is not carried out up to the etch stop layer 703 in a height direction of the opening portion (see an arrow Z).

On the contrary, it is assumed that the height C of the light reflecting metal wall 704 is set to be shorter than the lateral width W of the packaged light-emitting element. In this case, the etching is carried out up to the etch end layer 703 in the height direction of the opening portion but the etching is not carried out enough in a lateral direction of the opening portion. As a result, the light reflecting surface 704*a* has a shape causing a vicinity of the LED chip mounting surface to rise in a curved manner. This causes the area of the LED chip mounting not to be secured sufficiently.

It is possible to further carry out the etching because the etch end layer 703 is formed on a surface that is to be the LED chip mounting surface. However, an opening width of the light reflecting metal wall 704 becomes wider than necessary in the vicinity of the mask member 705, and the thickness of the light reflecting metal wall 704 becomes too thin in the vicinity of the mask member 705. This arises a problem that a shape of the light reflecting metal wall 704 can not be kept due to lack of strength.

For the aforementioned reasons, in order that (i) the area of the LED chip mounting surface and (ii) the thickness B of the light reflecting metal wall 704 are both secured while the height C of the light reflecting metal wall 704 is kept at a desired required height, the only way is to increase the size of a light-emitting element, in particular, the lateral width W of the short side of the packaged light-emitting element.

SUMMARY OF THE INVENTION

The present invention is made in view of the problems. An object of the present invention is to provide a method for manufacturing a light reflecting metal wall, in which method a light reflecting metal wall is stably formed by securing both (i) the area of the LED chip mounting surface and (ii) the thickness of the light reflecting metal wall even if a packaged light-emitting element has a narrow lateral width of its short side.

In order to attain the object described above, the method according to the present invention for manufacturing the light reflecting metal wall includes the step of (a) forming a cavity structure on a metal plate on which back surface a substrate is laminated, the cavity structure including on its side wall a light reflecting wall, the step (a) including the steps of (b) forming a first mask on a surface of the metal plate, the first mask having a mask opening portion corresponding to an opening portion of the cavity structure, and (c) forming the light reflecting wall on a side wall of the metal plate by carrying out wet etching with respect to the metal plate with the first mask, in the step (c), in the middle of the wet etching, the first mask being bent by press working along the light reflecting wall formed by the wet etching.

With the arrangement, the first mask is formed on the surface of the metal plate on which back surface the substrate is laminated, the first mask having a mask opening portion corresponding to an opening portion of the cavity structure. Then, the wet etching is carried out with respect to the metal plate with the first mask, thereby forming the light reflecting wall to the side wall of the metal plate. In the middle of the wet etching, the first mask is bent by press working along the light reflecting wall formed by the wet etching.

Therefore, the wet etching is carried out with respect to the surface of the metal plate while the rim of the opening portion of the cavity structure is protected with the first mask. Thus, (i) it is possible to stably keep the shape and strength of the manufactured metal plate while the thickness between the outer circumferential wall and the light reflecting wall on the cavity structure side is kept to a thickness of not less than a predetermined one and (ii) it is possible to secure the bottom width of the bottom part in the cavity structure of the metal plate while the opening width of the opening portion is suppressed.

As such, the cavity structure is stably formed by securing both (i) the area at the bottom of the cavity structure of the metal plate and (ii) the thickness of the metal plate even if a packaged light-emitting element has a narrow lateral width of its short side.

And, with this etching method, the light reflecting wall is arranged such that the opening portion is made smaller than the center part, thereby preventing a material (such as a resin material), which fills the cavity structure of the metal plate from coming off.

Additional objects, features, and strengths of the present invention will be made clear by the description below. Further, the advantages of the present invention will be evident from the following explanation in reference to the drawings.

BRIEF DESCRIPTION OF THE DRAWINGS

FIG. 6(a) illustrates an example of the mask opening portion, wherein the mask opening portion has a rectangular shape.

FIG. 6(b) illustrates another example of the mask opening portion, wherein the mask opening portion has a rectangular shape having slits at its four corners.

FIG. 7 is a perspective view illustrating an arrangement of the light-emitting element.

DESCRIPTION OF THE EMBODIMENTS

One embodiment of the present invention is described below referring to drawings.

Figure 1A:
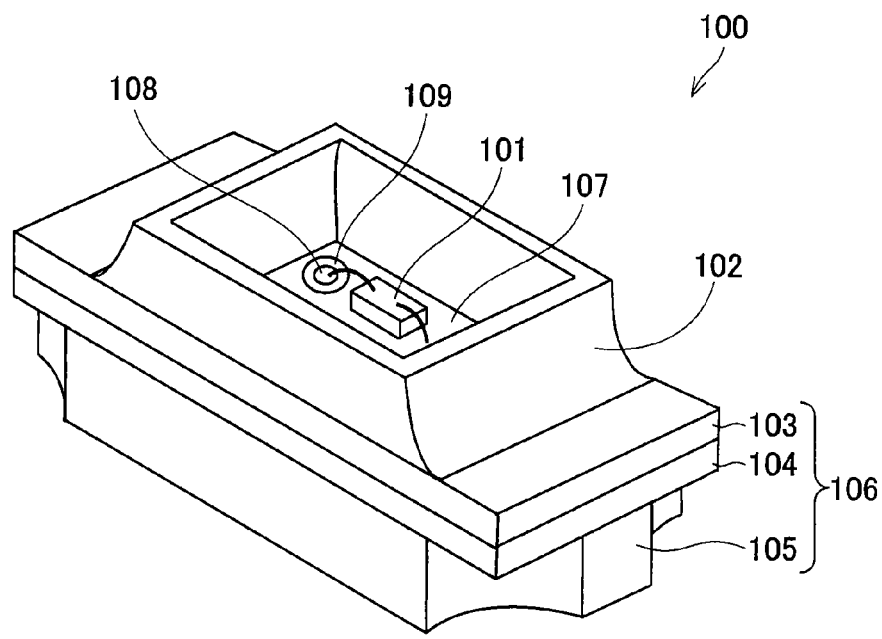
FIG. 1(a) is a perspective view illustrating a light-emitting element in accordance with an embodiment in a method according to the present invention for manufacturing a light reflecting metal wall, wherein a translucent sealing body has not been formed yet.
Figure 1B:
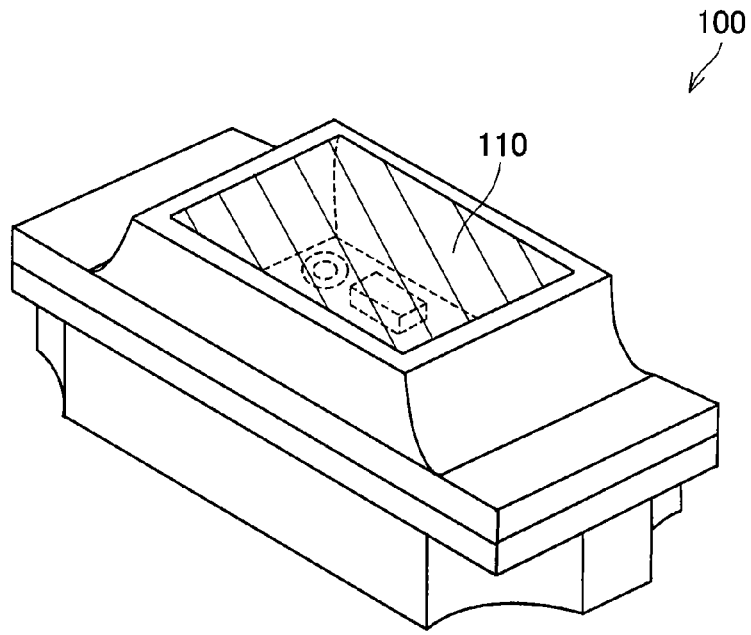
FIG. 1(b) is a perspective view of the light-emitting element, wherein the translucent sealing body has been already formed.

FIG. 1(a) illustrates an example of an arrangement of a light-emitting element 100 in which no translucent sealing body 110 has been provided yet, and FIG. 1(b) is a perspective view illustrating an example of an arrangement of the light-emitting element 100 in which a translucent sealing body 110 has been already provided.

Figure 2:
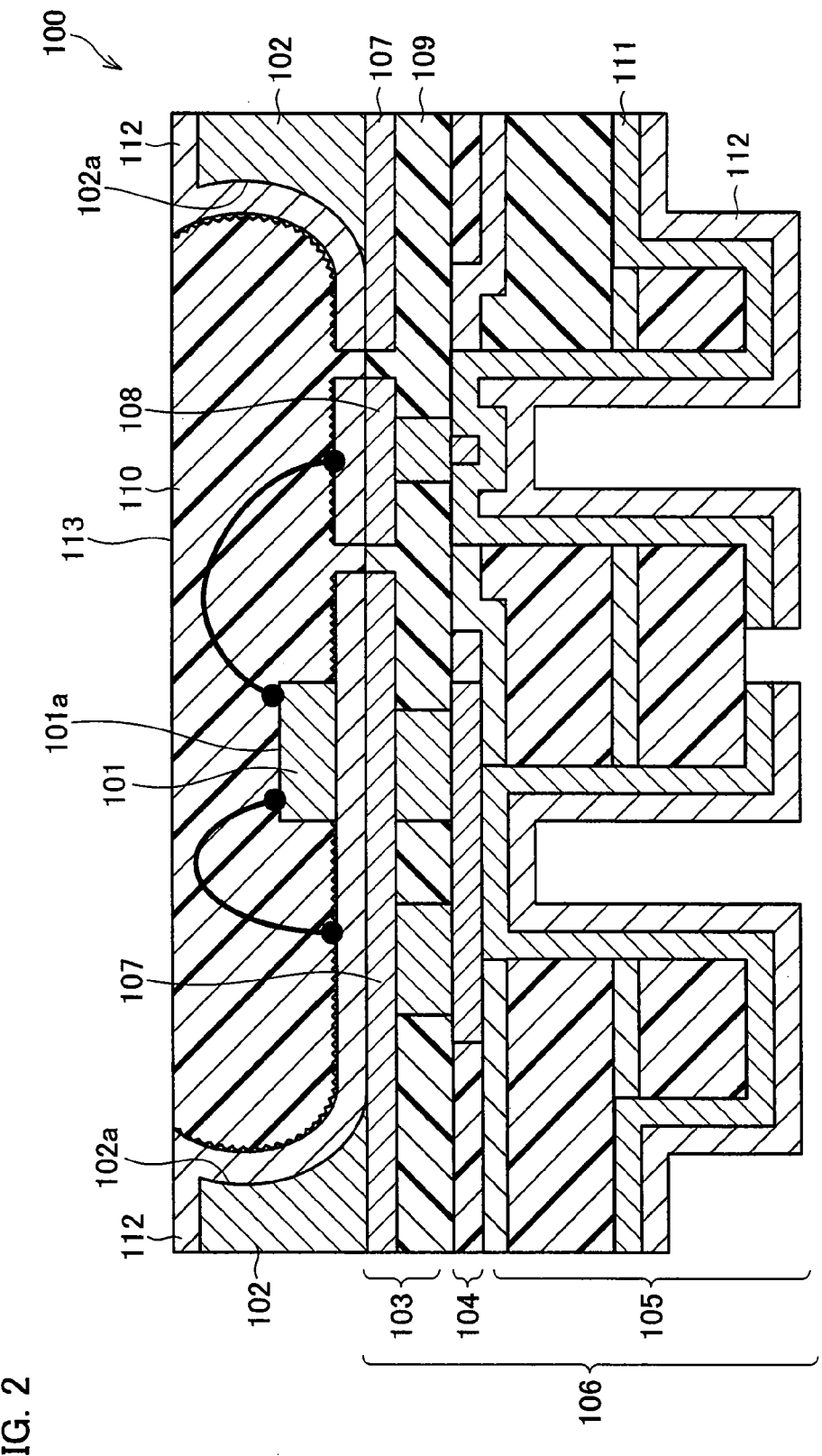
FIG. 2 is a side cross-section view illustrating an arrangement of the light-emitting element.

FIG. 2 is a side cross-section view illustrating an arrangement of the light-emitting element 100 in detail.

The light-emitting element 100 in accordance with the present embodiment is arranged such that its light outgoing surface is provided so as to face a side surface of a liquid crystal panel which is provided to a display screen of a mobile phone or the like. In short, the light-emitting element 100 is used as a backlight for irradiating the liquid crystal panel from the side of the liquid crystal panel.

As illustrated in FIGS. 1(a) and 1(b), the light-emitting element 100 in accordance with the present embodiment includes an LED chip 101, a light reflecting metal plate 102, a laminated substrate 106 (a surface layer 103, an intermediate layer 104 and a rear surface layer 105), a first electrode section 107, a second electrode section 108, an insulator 109, and a translucent sealing body 110.

The LED chip 101 is a semiconductor chip made of a semiconducting material such as a GaN based semiconducting material, and emits blue light from a light-emitting surface 101a. Further, the LED chip 101 is provided on the first electrode section 107 by die bonding such that the light-emitting surface 101a faces upward.

The LED chip 101 includes an electrode terminal (not illustrated) on the light-emitting surface 101a, the electrode terminal including an anode electrode and a cathode electrode.

The light reflecting metal plate 102 is arranged to reflect and direct light emitted from the light-emitting surface 101a of the LED chip 101 to a light outgoing surface 113. Moreover, the light reflecting metal plate 102 is made of copper, and is formed to be integral with the laminated substrate 106 on a mounting surface of a substrate so as to surround the LED chip 101, the second electrode section 108, and the insulator 109. More specifically, the light reflecting metal plate 102 is formed to be integral with the first electrode section 107 such that the first electrode section 107 is partially exposed in an inner circumference of the light reflecting metal plate 102.

Moreover, as illustrated in FIG. 2, the light reflecting metal plate 102 is formed such that the light reflecting wall 102a on the inner circumference side has an arch cross sectional shape in a lamination direction. In addition, an inner circumferential shape of the light reflecting metal plate 102 is formed by carrying out etching with respect to a metal plate whose shape is substantially a rectangular solid. Alternatively, the inner circumferential shape of the light reflecting metal plate 102 may be made by forming a concave shape by carrying out press working with respect to metal foil, and then carrying out etching with respect to the concave shape. This makes it easier to form the inner circumferential shape of the light reflecting metal plate 102, because the etching is carried out with respect to the concave shape that has been already formed.

An outer circumferential side surface of the light reflecting metal plate 102 is formed by the wet etching, the outer circumferential side surface being parallel to a short side direction of the light-emitting element 100. Therefore, its cross sectional shape perpendicular to the laminated substrate 106 is formed in a gradually curved shape. More specifically, the shape is gradually curved so as to be away from the LED chip 101 with closer toward a bottom end from a top end. Further, the outer circumferential side surface of the light reflecting metal plate 102 in a direction perpendicular to the short side direction of the light-emitting element 100, is formed by cutting both the light reflecting metal plate 102 and the laminated substrate 106 together.

The laminated substrate 106 is arranged so that the surface layer 103, the intermediate layer 104, and the rear surface layer 105 are laminated in the order of being closer to the mounting surface.

First of all, an arrangement of the surface layer 103 is described below.

On the surface layer 103, the first electrode section and the second electrode section 108 are formed as the electrode terminal for supplying a drive current to the LED chip 101, the electrode section being connected with the LED chip 101 respectively. Additionally, the insulator for electrically insulating the second electrode section from the first electrode section 107 is formed so as to surround an outer circumference of the second electrode section 108. Note that the surface layer 103, which is a surface of the laminated substrate 106, is the mounting surface where the LED chip 101 is to be mounted.

The first electrode section 107 is formed on the mounting surface so as to surround the outer circumference of the second electrode section 108 via the insulator 109. That is to say, between the light reflecting metal plate 102 and insulator 109, both of which are formed on the mounting surface, the first electrode section 107 is formed as a light reflecting metal film of the mounting surface, as well.

Moreover, the first electrode section 107 is connected with the cathode electrode of the LED chip 101 by wire bonding. The first electrode section 107 and the light reflecting metal plate 102 are made of the same kind of metal (which is copper in the present embodiment), and are formed so as to be integral with each other.

Note that a material of the first electrode section 107 and the light reflecting metal plate 102 is not limited to copper, but other metal may be adopted. However, it is preferable to adopt a material, having high light reflectivity, such as copper, silver, gold, nickel or aluminum.

Thus, since the light reflecting metal plate 102 and the first electrode section 107 are integral with each other, a rate of metal in a whole element increases. This allows an improvement in a heat radiation effect and an improvement in a prevention of a light leak.

The second electrode section 108 is made of copper, and connected with the anode electrode of the LED chip 101 by wire bonding. Further, in an area surrounded with the light reflecting metal plate 102 on the mounting surface, the second electrode section 108 is formed in an island shape such that its outer circumference is surrounded with the insulator 109.

Furthermore, the shape of the second electrode section 108 is not limited to the example in the present embodiment. A triangle, a square, a rectangular or the like may be adopted. However, it is more preferable that the second electrode section 108 has a shape such that its corners are rounded to prevent an electrical field from being concentrated on the corners.

Additionally, according to the present embodiment, as described above, the cathode electrode of the LED chip 101 is connected with the first electrode section 107, and the anode electrode is connected with the second electrode section 108. However, the present embodiment is not limited to this arrangement. Alternatively the anode electrode of the LED chip 101 may be connected with the first electrode section 107, and the cathode electrode may be connected with the second electrode section 108. The first electrode section 107 has an electric potential different from the second electrode section 108. As such, one of the anode electrode and the cathode electrode is connected with the first electrode section 107 and the other is connected with the second electrode section 108, in accordance with the design.

The insulator 109 is made of resin, and is formed to electrically insulate the second electrode section 108 from the first electrode section 107. Moreover, the insulator 109 is formed in a circular shape (a doughnut shape) so that the insulator 109 surrounds the outer circumference of the second electrode section 108.

Thus, even when, in an area surrounded with the light reflecting metal plate 102 on the mounting surface, the first electrode section 107 (serving as the light reflecting metal film of the mounting surface) is formed all over the mounting surface except the second electrode section 108 and the insulator 109 so as to surround the outer circumference of the second electrode section 108 via the insulator 109, it is possible to insulate the second electrode section 108 from other portions in such an area. This allows most of light, directing toward the substrate, among the light emitted from the LED chip 100 to be reflected from the first electrode section 107 so as to be directed toward the light outgoing surface 113 formed in a light-emitting direction. As such, it is possible to reduce (i) the amount of light to be absorbed by the substrate and (ii) the amount of light which goes through the substrate and comes out of the element from a backside of the substrate. This allows an improvement in the intensity of light emitted from the light outgoing surface 113.

Further, it is possible that the light-emitting element 100 achieves an improvement in the heat radiation, by (i) reducing a low heat radiation area where resin is formed and (ii) forming the first electrode section 107 (serving as the light reflecting metal film of the mounting surface) widely. Furthermore, it is possible to direct outward and radiate the heat produced in the light reflecting metal plate 102, efficiently, as the first electrode section 107 is formed so as to be integral with the light reflecting metal plate 102.

Therefore, in short, on the surface layer 103, the first electrode section 107 and the second electrode section 108 are formed, the first electrode section 107 being laminated so as to be integral with the light reflecting metal plate 102, the first electrode section 107 and the second electrode section 108 being formed so that the insulator 109 is sandwiched therebetween, the second electrode section 108 being formed so as to be surrounded by the insulator 109. In addition, the surface layer 103 also constitutes a layer including a conductive portion for electrically connecting each electrode section formed on the mounting surface to the intermediate layer 104. An area where the conductive portion is formed is selected arbitrarily according to a factor such as shapes of the first electrode section 107 and the second electrode section 108.

Then, the intermediate layer 104 is provided for connecting the surface layer 103 to each electrode section formed on the rear surface layer 105 (later described). The intermediate layer 104 constitutes a layer including a conductive portion for electrically connecting the surface layer 103 to the rear surface layer 105.

Next, the rear surface layer 105 is described below.

The rear surface layer 105 is made of a base material which is prepared by combining a plurality of substrates such as glass epoxy substrates with the use of an adhesive tape. In addition, the rear surface layer 105 includes the anode electrode and the cathode electrode, each being connected to other component and input and output an electrical signal with the outside.

The anode electrode and the cathode electrode are formed by pressing and attaching the rear surface layer 105 to the intermediate layer 104 via the adhesive tape, and then performing a copper plating 111 with respect to an inner circumferential surface of their respective through-hole. The copper plating 111 of the through holes are electrically connected to the first electrode section 107 and the second electrode section 108, respectively. In addition, a silver plating 112 is formed on the anode electrode and the cathode electrode, when the silver plating 112 is carried out with respect to the inner circumferential light reflecting wall 102a of the light reflecting plate 102.

The translucent sealing body 110 is formed to seal an inner space (a space in a cavity) surrounded with the laminated substrate 106 and the light reflecting metal plate 102. Additionally, the translucent sealing body 110 is made of resin, and silicone is adopted in the present embodiment. Light emitted from the light-emitting surface 101a of the LED chip 101 is emitted from the light outgoing surface 113 provided in the light-emitting direction of the translucent sealing body 110.

A silver plating 112 is performed with respect to a top surface of the light-reflecting metal plate 102 and with respect to the inner circumferential light reflecting wall 102a. Silver has quite high light reflectivity with respect to blue light. As such, the silver plating 112 allows the light emitted from the LED chip 101 to be efficiently reflected so as to be directed to the light outgoing surface 113.

Additionally, the translucent sealing body 110 has a function of protecting the LED chip 101 and the silver plating 112. As described above, the silver plating 112, having quite high light reflectivity with respect to blue light, is performed with respect to the light reflecting metal plate 102 in order to efficiently reflect the light emitted from the LED chip 101. Note however that silver has high reactivity, so that silver is likely to be changed in color and deteriorated, easily, due to corrosive gas or the like. As such, the silver plating 112 is protected by the translucent sealing body 110 so that silver is prevented from reacting or coming off even under any adverse condition.

According to the arrangement of the present embodiment, as described above, in the area surrounded with the mounting surface and the light reflecting metal plate 102, an upper end, in the light-emitting direction of the LED chip 101, of the area is opened as the light outgoing surface 113, and the translucent sealing body 110 is formed so as to fill the area. Further, the area includes an area, where a maximal breadth of a cross sectional surface in a surface direction is greater than a maximal breadth of the light outgoing surface 113, provided in a center part between the light outgoing surface 113 (the opening portion at the upper end) and the mounting surface to become a bottom surface. The opening is provided from such a center part toward the light outgoing surface 113.

Furthermore, an inner circumferential surface that touches the translucent sealing body 110 has a concavo-convex shape in (i) an area where the silver plating 112 is performed with respect to the light reflecting wall 102a of the light reflecting metal plate 102 and (ii) an area where the silver plating 112 is performed with respect to the first electrode section 107 and the second electrode section 108.

Such a concavo-convex shape is preferably a shape in which sharp concaves and convexes are continued. As a method for obtaining a concavo-convex shape, various methods, which are used generally and conventionally, may be adopted. For example, it is possible for light reflecting metal plate 102 to have a concavo-convex shape by making an etchant or etching condition different from an usual condition in a step for forming the light reflecting metal plate 102 by etching, or in the following etching step for removing a nickel layer (not illustrated) on the mounting surface, which the nickel layer is provided between the light reflecting metal plate 102 and the surface layer 103.

The silver plating 112, as described above, has high reactivity, and is easily deteriorated and corroded, so that it is necessary to protect the silver plating 112 from exfoliation and/or corrosion. As such, in the arrangement of the present embodiment, the translucent sealing body 110 and the silver plating 112 are made stick together. This allows an improvement in the function of the translucent sealing body 110 as a protection film.

Moreover, the translucent sealing body 110 includes a fluorescent material. This causes the blue light emitted from the LED chip 101 to be converted into yellow light in the translucent sealing body 110. Thus, it is possible that white light from the light outgoing surface 113 is to be emitted by a combination of the blue light emitted from the LED chip 101 and the yellow light emitted from the fluorescent material.

Note that, it is possible to attain the white light from the blue light emitted from the LED chip 101, by a method such as a method of using an yellow fluorescent material as described above or a method of using a green fluorescent material and a red fluorescent material. By using such a combination, mixture of light occurs, thereby making it possible to attain the white light.

Thus, according to the light-emitting element 100 of the present embodiment, the light reflecting metal plate 102 that reflects the light emitted from the LED chip 101 to the light outgoing surface provided in the light-emitting direction, stands in the light-emitting direction of the LED chip 101 so as to surround all-around the LED chip 101. This causes the light emitted around from the LED chip 101 to be reflected from the light reflecting metal plate 102 so as to be efficiently directed toward the light exit surface. As a result, light leaked from a side of an element is prevented, thereby improving the intensity of the light emitted from the light outgoing surface.

In addition, in the area surrounded with the light reflecting metal plate 102 on the mounting surface, the first electrode section 107 (serving as the light reflecting metal film of the mounting surface) is formed, except an area where the insulator 109 for insulating the second electrode section 108 from the first electrode section 107 is formed. This allows most of light, directing toward the laminated substrate 106, among the light emitted from the LED chip 101 to be reflected from the first electrode section 107 so as to be directed toward the light outgoing surface 113 provided in the light-emitting direction. As such, it is possible to reduce (i) the amount of light to be absorbed by the laminated substrate 106 and (ii) the amount of light which goes through the laminated substrate 106 and comes out of the element from the backside of the laminated substrate 106. This allows an improvement in the intensity of light emitted from the light outgoing surface 113.

Additionally, silicone used in the translucent sealing body 110 of the light-emitting element 100 does not have a highly adhesiveness. As such, if silicone is just attached to a surface, there is a possibility that it may come off.

However, in the light-emitting element 100 in accordance with the present embodiment, as described above, the light reflecting metal plate 102 is arranged such that the opening portion, serving as the light outgoing surface 113 and provided at the upper end in the light-emitting direction, is made smaller than the center part between the opening portion and the bottom surface of the mounting surface. This prevents the translucent sealing body 110 from coming off from the light-emitting element 100.

Further, the convex and concave are formed on the inner circumferential surface of the light reflecting plate 102, which inner circumferential surface is subjected to the silver plating 112 and touches the translucent sealing body 110. Thus, a touch area where the translucent sealing body 110 touches the light reflecting metal plate 102 is enlarged. This improves a degree of adhesion between the translucent sealing body 110 and the light reflecting metal plate 102, thereby preventing the translucent sealing body 110 from coming off.

Additionally, a shape of the opening portion of the light reflecting metal plate 102, and a shape of the outer circumferential side of the light reflecting metal plate 102 may be determined in accordance with a shape, with which the etching can be performed easily, and design. Moreover, since there has been a demand of miniaturizing a light source, an outer size of the light-emitting element is preferably as small as possible. On the other hand, it is preferable to design the opening portion of the light reflecting metal plate 102 as large as possible while achieving a miniaturization of the element, in view of securing a light-emitting area of the light source.

The present embodiment deals with the arrangement in which a single LED chip is provided. However, the present invention is not limited to that. The present invention is applicable to an arrangement in which more than two LED chips are provided. When a plurality of LED chips are thus provided in a single light-emitting element arbitrarily, it is possible to improve the intensity of emitting light without enlarging the element in size.

Further, according to the light-emitting element 100 of the present embodiment, in the area surrounded with the mounting surface and the light reflecting metal plate 102, an upper end, in the light-emitting direction of the LED chip 101, of the area is preferably opened as the light outgoing surface 113, and the translucent sealing body 110 is formed so as to fill the area. Further, the area preferably includes an area, where a maximal breadth of a cross sectional surface in a surface direction is greater than a maximal breadth of the light outgoing surface 113, provided in a center part between the light outgoing surface 113 and the mounting surface to become a bottom surface. The opening is preferably provided from such a center part toward the light outgoing surface 113.

As the LED to be provided to the light-emitting element 100, a blue LED, which emits blue light, is generally used. Therefore, the surface of the light reflecting metal plate 102 is subjected to the silver plating which has high light reflectivity to blue light so as to have higher light reflectivity. However, as described above, the silver plating has high reactivity, and is easily deteriorated and corroded. As such, it is necessary that the silver plating 112 be protected from the exfoliation and corrosion. In view of this, the light-emitting element 100 is arranged so that the filling of the translucent sealing body 110 is carried out so that the translucent sealing body 110 and the silver plating are made stick together.

Because of this, a material, such as silicone which has less adhesiveness than epoxy or the like, is generally used as sealing resin of the translucent sealing body 110. Therefore, as the arrangement, the opening portion, which will be the light outgoing surface 113 (i.e. the opening surface of the translucent sealing body 110), is made small, thereby (i) achieving higher adhesion between the translucent sealing body 110 and the light reflecting wall 102a of the light reflecting metal plate 102 and (ii) preventing the translucent sealing body 110 from coming off. As a result, the translucent sealing body 110 can protect the light reflecting wall 102a of the light reflecting metal plate 102 in a stable condition.

First Step for Manufacturing in the Present Embodiment

The following describes a method for manufacturing a light-emitting element 100 in accordance with the present embodiment.

Figure 3A:
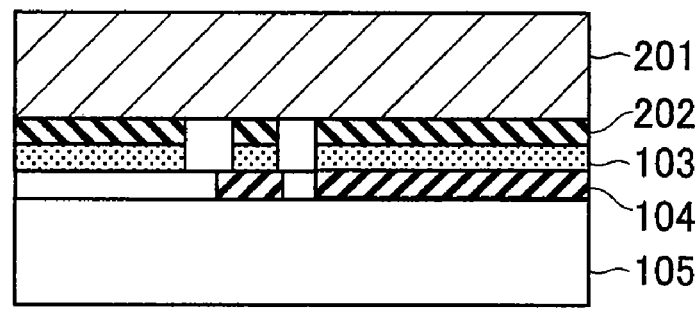
FIGS. 3(a) and 3(b) are flow sheets, each of which illustrates a step for manufacturing the light-emitting element.
Figure 3B:

First of all, a step for manufacturing the light-emitting element 100 in accordance with the present embodiment is hereinafter explained briefly with reference to FIGS. 3(a) and (b). FIG. 3(a) illustrates a state of the light reflecting metal plate 102 where the light reflecting wall 102a has not been formed yet, and FIG. 3(b) illustrates a state of the light reflecting metal plate 102 where the light reflecting wall 102a has been already formed. Note that the light-emitting element 100 is not manufactured individually, but a plurality of light-emitting elements are simultaneously manufactured in a single metal foil plate while they are disposed at a prescribed interval on the metal foil. However, FIGS. 3(a) and 3(b) illustrate only a single light-emitting element for convenience.

The following describes a manufacturing step required for a light-emitting element 100 to come into the state illustrated in FIG. 3(a).

As a first base, metal foil 201 (a metal plate) (in this embodiment, copper foil) is adopted. All over a surface (which is to be the LED mounting surface side finally) on which a substrate of the metal foil 201 is formed, a metal plating layer 202 (in this embodiment, nickel) is formed, which metal plating layer 202 is made of metal different from the metal foil 201. On a reverse surface of the surface layer 103 to the surface on which this nickel plating layer 202 is formed, a resin layer having a multi-layer wiring (the surface layer 103 and the intermediate layer 104) is formed, which resin layer includes a wiring layer and epoxy resin. A method for manufacturing the resin layer having a multi-layer wiring may be, but not limited to, a general method such as a via filling method for forming a resin layer having multi-layer wiring. A rear surface layer 105 (in this embodiment, a glass epoxy substrate) is attached to the resin layer having the multi-layer wiring. The rear surface layer 105 is prepared by a resin sheet, having a through-hole for pulling out a back electrode.

Additionally, as described above, the rear surface layer 105 is attached under the intermediate layer 104, and is generally used as an electrode that has been subjected to mounting of the light-emitting element 100 and the backlight of the liquid crystal display panel. Therefore, a detailed explanation is not described for convenience.

Further, the arrangement made after the resin layer having the multi-layer wiring is not limited to the above arrangement. It is also possible to have an arrangement in which no resin layer having the multi-layer wiring is provided. Note however that the arrangement should be the one in which the wiring layer electrically connects between a rear surface and a front surface which will ultimately become the LED chip mounting surface.

The step leads the light-emitting element 100 to the state illustrated in FIG. 3(a).

Then, after the rear surface layer 105 is attached, etching is performed, with the use of the above described photo process, with respect to a surface (a surface to become the light outgoing surface 113) of the metal foil 201, to which surface no patterning is carried out. A detailed explanation is going to be described later. After the rear surface layer 105 is attached, a nickel plating is performed with respect to all over the surface of the metal foil 201, to which surface no patterning is carried out. After that, the patterning is performed with respect to the surface of the metal foil 201 such that an area of the light outgoing surface 113 has an opening portion. This patterned nickel plating is used as a mask member, and functions as an etch stop layer. And then, the metal foil 201 is etched such that the etching reaches and exposes the surface layer 103 (the aforementioned nickel plating layer 202) of the laminated substrate 106, the surface layer 103 ultimately becoming a mounting surface. This secures a flat area required as the LED chip mounting surface. As a result, as illustrated in FIG. 3(b), an inner space, that is, a cavity structure is formed, which is surrounded with the light reflecting metal wall 102a of the light reflecting plate 102 and the surface layer 103 (the nickel plating layer 202) of the laminated substrate 106.

Plating, such as the silver plating which has high light reflectivity with respect to the light emitted from the LED chip 101, is performed with respect to the light reflecting metal plate 102 so that the light reflecting metal plate 102 improves in light reflectivity.

Thus, the etching causes the metal foil 201 to become a light reflecting metal plate 102 having a light reflecting wall 102a on its inside. The nickel plating layer 202 is removed from the bottom portion of the hollow light reflecting metal plate 102 which has been subjected to the etching. This causes the surface layer 103 of the laminated substrate 106 to be exposed, thereby providing a mounting surface. In addition, the second electrode section 108 formed on the surface layer 103 of the laminated substrate 106 is insulated from the first electrode section 107 by the insulator 109, which surrounds the outer circumference of the second electrode section 108. The first electrode section 107 and the light reflecting metal plate 102 are made of same metal, and are formed to be integral with each other. Therefore, the second electrode section 108 is designed and provided such that at least the second electrode section 108 does not touch the light reflecting metal plate 102.

After the LED chip 101 is positioned, and is electrically connected via wire by, for example, wire bonding, resin such as epoxy or silicone is filled into the inner space (the cavity structure) surrounded with the light reflecting metal plate 102 and the surface layer 103 of the laminated substrate 106 so that the LED chip 101 and the wire are sealed. Then, the resin is solidified, thereby casting the translucent sealing body 110. At this time, the translucent sealing body 110 may include a fluorescent material, if necessary. After the translucent sealing body 110 is casted, a plurality of the light-emitting elements are diced along a cutting-plane line to be separated from each other, thereby taking out individual light-emitting elements 100.

Therefore, with the manufacturing method, it is possible that the light reflecting metal plate 102 and the laminated substrate 106 are integral with each other, thereby improving the heat radiation characteristics. Moreover, the second electrode section 108 is finely formed, so that it is possible to make a width of the light-emitting element 100 thinner. This allows a backlight of a liquid crystal display panel having a light-emitting element in accordance with the present embodiment to be thinner.

One of the features of the present invention resides in a method for manufacturing a light reflecting wall 102a of the light reflecting metal plate 102 (a method for manufacturing a light reflecting metal wall). The following describes a method for manufacturing a light reflecting wall 102a of the light reflecting metal plate 102 of the light-emitting element 100 in accordance with the present embodiment in detail.

FIGS. 4(a) through 4(g) are flowcharts each illustrating a step for manufacturing the light reflecting wall 102a of the light reflecting metal plate 102 of the light-emitting element 100 in accordance with the present embodiment. In addition, FIGS. 4(a) to 4(g) illustrate the steps that are performed during the steps, i.e., from the step illustrated in FIG. 3(a) to the step illustrated in FIG. 3(b). Note that layers below the surface layer 103 are not illustrated in FIGS. 4(a) to 4(g) for convenience.

Figure 4A:
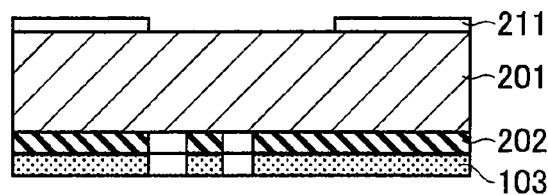
FIGS. 4(a) to 4(g) are flow sheets, each of which illustrates a step for manufacturing the light reflecting metal wall of the light-emitting element.

After the step illustrated in FIG. 3(a), as illustrated in FIG. 4(a), a patterning is carried out with respect to the metal foil 201 such that an area to become the light outgoing surface 113 has an opening portion, so as to form a mask member 211 (a first mask).

In a case where, a shape of the opening portion of the light reflecting metal plate 102 is a rectangle as illustrated in FIG. 1(a), the opening portion of the mask member 211 should be formed in the same rectangular shape (quadrangular shape) as illustrated in FIG. 6(a). Alternatively, as illustrated in FIG. 6(b), the shape of the opening portion of the mask member 211 may be a rectangle where slits (cut areas) Xa are formed at its four corners. That is to say, a mask member 211 is formed on the metal foil 201 such that the slits Xa, which are illustrated in FIG. 6(b), are formed at portions to become four corners X of the opening portion 115 of the light reflecting metal plate 102 illustrated in FIG. 7.

Figure 4B:
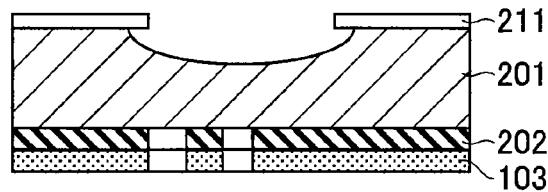

Then, as illustrated in FIG. 4(b), after the mask member 211 is formed on the metal foil 201, wet etching is performed. FIG. 4(b) illustrates a condition where the wet etching is being performed.

Figure 15:
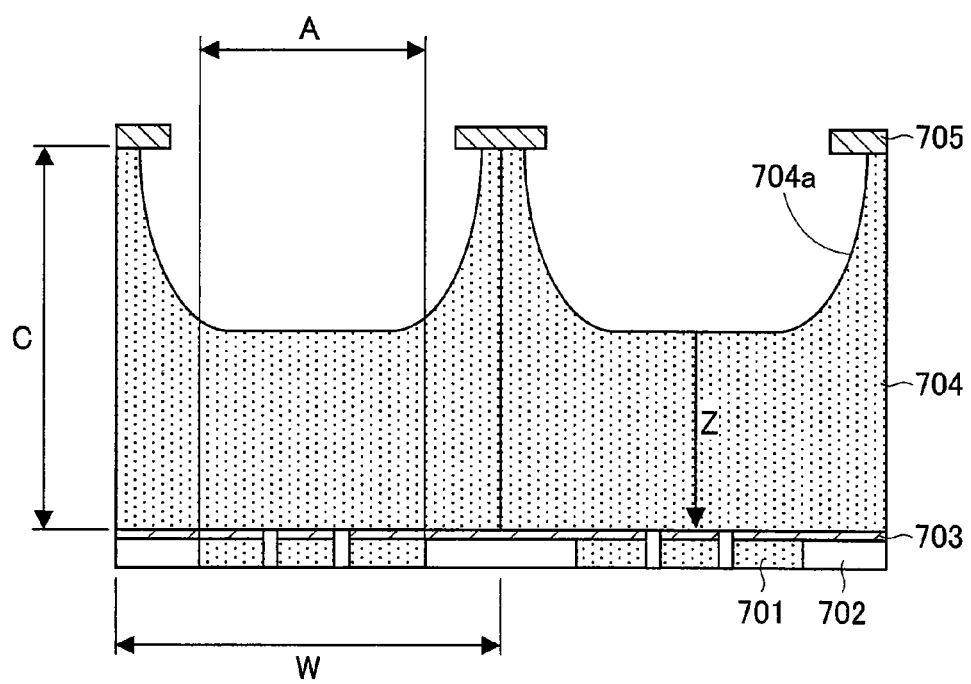
FIG. 15 is a side cross-section view illustrating the conventional light-emitting element, wherein etching is not carried out up to a substrate.

During the wet etching, as illustrated in FIG. 4(b), the mask member 211 includes a rim constituting the opening portion, which rim is usually flat (even). In this case, as described above with reference to FIG. 15, since metal is a material that is etched isotropically, if an usual method in which a metal plate is protected with a mask member is adopted, then wet etched, it is difficult to form a desired shape of the opening portion of the light reflecting wall 102a.

Figure 4C:
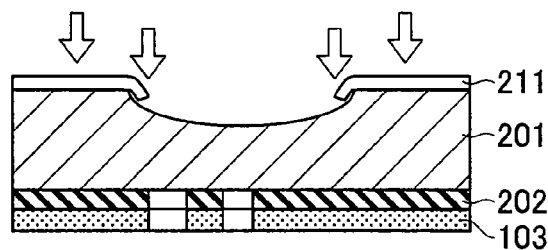

In contrast, according to a method for manufacturing the light reflecting wall 102a of the light reflecting metal plate 102 of the light-emitting element 100 in accordance with the present embodiment, as illustrated in FIG. 4(c), the mask member 211 is pressed from above toward the surface layer 103 (the laminated substrate 106) so that the mask member 211 is bended along the rim of the opening portion.

This pressing process is performed by pushing an elastic body, such as rubber, into the mask member 211 from above toward the surface layer 103. During the pressing process, the elastic body enters into a concave shape formed by the wet etching, so that the mask member 211 between the elastic body and the metal foil 201 is bended along the rim of the opening portion. Note that the elastic body preferably has such elasticity that the elastic body can bend the mask member 211 by plastic deformation and can fill the whole concave shape.

This causes the mask member 211, which has been bent, to cover around the opening portion of the light reflecting metal plate 102, thereby allowing the etching not to proceed around the opening portion but to proceed toward the surface layer 103, i.e., toward an area which is not covered with the mask member 211.

Figure 4D:
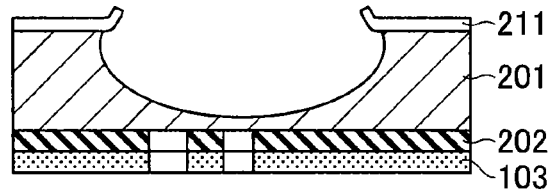
Figure 4E:
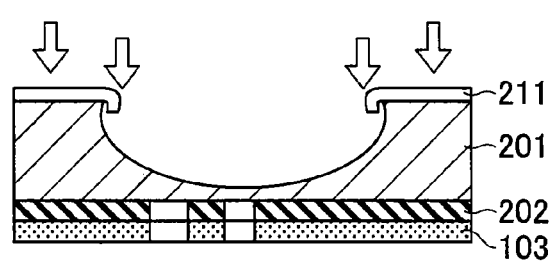
Figure 4F:
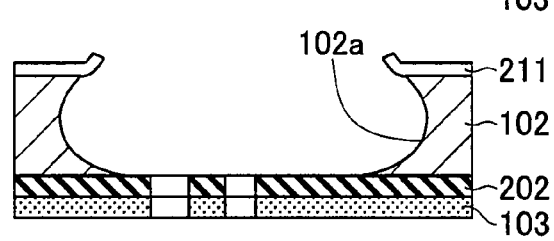
Figure 4G:
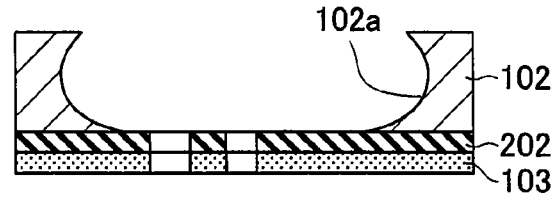

After that, when the wet etching is further carried out with the pressed mask member 211 as illustrated in FIG. 4(c) causes the metal foil 201 to be formed as the light reflecting metal plate 102 which has in its inside a light reflecting wall 102a, as illustrated in FIG. 4(f). This makes it possible to form a desired shape of the opening portion of the light reflecting wall 102a. And, as illustrated in FIG. 4(g), that is, FIG. 3(b), the mask member 211 is exfoliated so that the light reflecting metal plate 102 having the cavity structure is ultimately realized. Note that this description shows a case where the step illustrated in FIG. 4(f) comes right after the step illustrated in FIG. 4(c), without the steps illustrated in FIGS. 4(d) and 4(e).

Meanwhile, the description deals with the case where, in the middle of the wet etching, as illustrated in FIG. 4(b), the mask member 211 includes the flat (even) rim constituting the opening portion. Note however that, in the middle of the wet etching, the mask member 211 may turn up (in an opposite direction to the direction toward the surface layer 103) due to (i) water pressure in the wet etching or (ii) distortion occurred during releasing of lamination stress (or the combination of the above (i) and (ii)).

For example, in a state of the mask member 211 illustrated in FIG. 4(b), there may be a case where the rim constituting the opening portion may not be flat, and turn up. Alternatively, even after the mask member 211 is bent, as illustrated in FIG. 4(c), the mask member 211 may turn up in the middle of the wet etching, as illustrated in FIG. 4 (d).

Therefore, in a case where the mask member 211 turns up, etchant is apt to run fast around the opening portion of the metal foil 201. This causes the etching to be accelerated around the opening portion. For example, in a case where the mask member 211 turns up due to water pressure, the rim of the opening portion of the mask member 211 becomes an easily movable thin film whose shape can not be stabilized. As a result, the opening width of the opening portion can not be kept. This turning up of the mask member 211 causes the etching to be accelerated in a lateral direction, so that the opening width can not be reduced.

In order to prevent this, with the use of the same press working method as the step illustrated in FIG. 4(c), the mask member 211 which has turned up is pressed from above toward the surface layer 103 (the laminated substrate 106), so as to bend the turned up portion of the mask member 211. This makes it possible to further carry out the etching while keeping the opening width of the opening portion.

This can be explained by using a state illustrated in FIG. 4(d). After the state illustrated in FIG. 4(d), the mask member 211 is bent along the rim of the opening portion, as illustrated in FIG. 4(e). And then, as illustrated in FIG. 4(e), when the wet etching is further carried out with the pressed mask member 211, the metal foil 201 is formed as the light reflecting metal plate 102 which has the light reflecting wall 102a on its inner circumferential surface, as illustrated in FIG. 4(f). This makes it possible to form a desired shape of the opening portion of the reflecting wall 102a, even if the mask member 211 has turned up in the middle of the wet etching. And, as illustrated in FIG. 4(g), the mask member 211 is exfoliated and the manufacturing of the light reflecting metal plate 102 having the cavity structure is ultimately completed.

As described above, in a method for manufacturing the light reflecting wall 102a of the light reflecting metal plate 102 of the light-emitting element 100 in accordance with the present embodiment, the mask member 211 is bent once with the use of the elastic body along the rim of the opening portion, irrespective of whether the mask member 211 turns up or not in the middle of the wet etching according to the mask member 211. After that, the wet etching is further carried out with the pressed mask member 211. This allows a desired shape of the opening portion of the light reflecting wall 102a to be formed.

On the other hand, in a case where the mask member 211 further turns up while the wet etching is further carried out, the mask member 211 is again bent with the use of the elastic body along the rim of the opening portion in the same way as the previous case. In short, as illustrated in FIGS. 4(c) through 4(e), in a case where the mask member 211 turns up while the wet etching is carried out with the mask member 211, the step is carried out in which the mask member 211 is bent by press working from above toward the surface layer 103. This step is stopped when the etched surface of the metal foil 201 reaches the surface layer 103 (the nickel plating layer 202) of the laminated substrate 106. As a result, it becomes possible to form the metal foil 201 as the light reflecting metal plate 102 which has on its inner circumferential surface the light reflecting wall 102a having a desired shape.

Further, from another point of view, by protecting the rim of the opening portion of the metal foil 201 with the mask member 211, the etching proceeds so that, when the manufacturing of the light reflecting metal plate 102 is completed, the light reflecting metal plate 102 has an appropriate thickness between an outer circumferential side wall and the light reflecting wall 102a on the cavity structure side. Therefore, the amount of the etching in a lateral direction for the same period of time satisfies the following inequality: "a light reflecting metal plate 102 with the mask member which turns up (the mask member is an easily movable thin film)>a light reflecting metal plate 102 with no turning up of the mask member>a light reflecting metal plate 102 with the mask member which is press worked". Note that, in the case of forming the opening portion of the mask member 211 illustrated in FIG. 6(b), slits are formed at its four corners, so that it is possible to bend corners easily in the press working.

In addition, it is possible to add the following step for ultimately forming a shape of the light reflecting wall 102a on the inner circumferential surface of the light reflecting plate 102.

FIGS. 5(a) through 5(d) are flowcharts illustrating the manufacturing steps proceeded after the step illustrated in FIG. 4(g). Note that layers below the surface layer 103 are not illustrated for convenience.

Figure 5A:
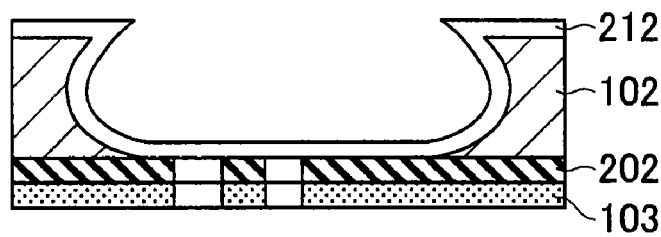
FIGS. 5(a) to 5(d) are flow sheets, each of which illustrates a step following the step illustrated in FIG. 4(g), for manufacturing the light reflecting metal wall of the light-emitting element.

After the step illustrated in FIG. 4(g), as illustrated in FIG. 5(a), a plating such as a nickel plating 212 (a first metal plating), which is to later become a mask member 213, is formed on the surface of the light reflecting metal plate 102 from which where the mask member 211 is exfoliated, which surface is the inner circumferential surface of the light reflecting plate 102. Note that other than nickel, the metal plating 212 is preferably made of solder, gold, tin or lead.

Figure 5B:
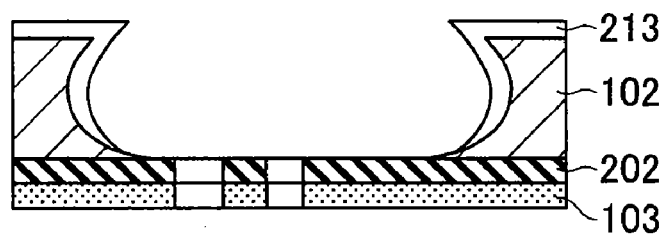

Then, as illustrated in FIG. 5(b), a part of this nickel plating 212 is removed, the part becoming the bottom surface when surrounded with the light reflecting wall 102a formed in the previous step, and then the remaining nickel plating 212 becomes a mask member 213 (a second mask). Namely, a patterning is carried out with respect only to the bottom surface of the nickel plating 212 so that the opening portion is provided.

Figure 5C:
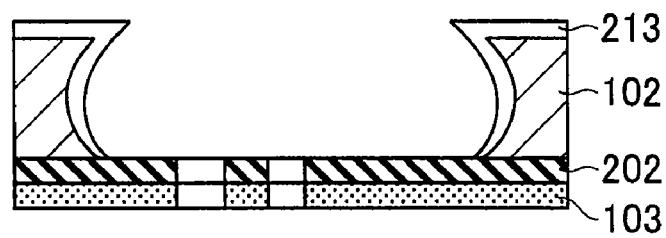
Figure 5D:
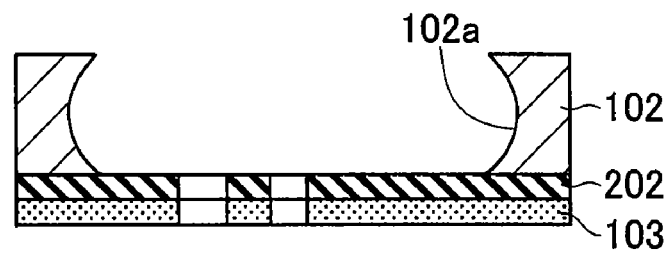

After that, as illustrated in FIG. 5(c), the wet etching is carried out with the mask member 213 thus formed, thereby ultimately forming the shape of the light reflecting wall 102*a* of the light reflecting metal plate 102. Thereafter, as illustrated in FIG. 5(*d*), the mask member 213 is exfoliated.

This allows the inner circumferential light reflecting wall 102*a* to be suitably formed with adjustments by alterations and additions.

Figure 8:
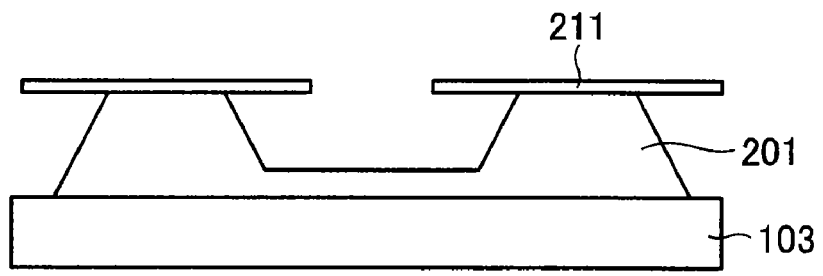
FIG. 8(a) illustrates an usual state of the metal plate after the metal plate has been first-etched already.
FIG. 8(b) illustrates a state of the metal plate, wherein a mask member turns up after the metal plate has been already first-etched.
FIG. 8(c) illustrates a state of the metal plate, wherein the mask member is pressed after the metal plate has been already first-etched.
Figure 8:
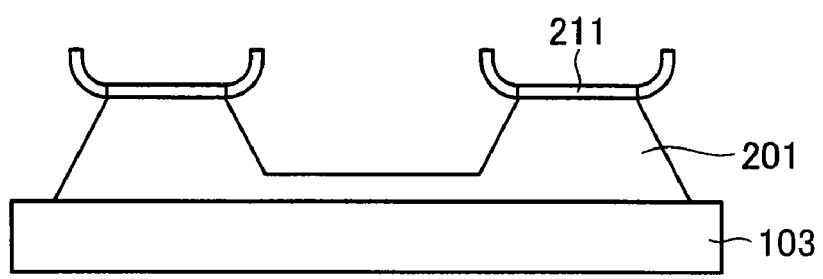
Figure 8:
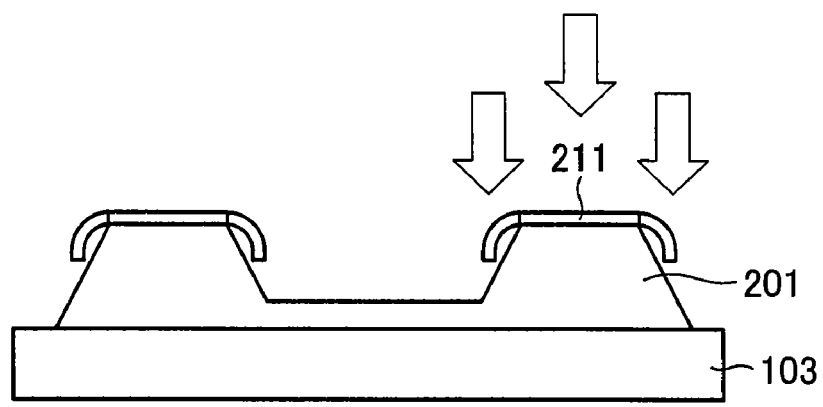

Note that the mask member 211 turns up in the etching in FIG. 4(*d*). Slight difference in water pressure or the like may cause a change in degree of how much the mask member turns up. This causes the shape of the opening portion near from the mask member 211 not to be uniform. This is not preferable, because non-uniformity of the shape of the opening portion causes the inner surface shape of the light reflecting wall 102*a* not to be uniform. In view of this, the mask member 211 is arranged so as to have a sufficient thickness and strength. For example, in a case of the mask member 211 made of nickel, when the thickness is not less than 3 μm, the mask member 211 can not turn up due to water pressure and keep its initial shape, as illustrated in FIG. 8(*a*). This allows highly reproducible and stable etching to be carried out. Moreover, it becomes also possible to have high mass productivity.

Additionally, the mask member 211 is not deformed due to water pressure in the etching but can be bent by the press working, and is also preferably arranged such that it will not be deformed due to water pressure after it is further bent. Other than nickel, the mask member is preferably made of solder, gold, tin, or lead. The thickness of the mask member 211 is adjusted in accordance with the mask material arbitrarily. When the mask member 211 is thus selected, the mask member 211 does not turn up. This results in that it is necessary to carry out the step for bending the mask member 211 only once.

The method for manufacturing the light reflecting wall 102*a* of the light reflecting metal plate 102 including the steps of (i) forming the mask member 211 on the surface of the metal plate 201, the mask member 211 having a mask opening portion corresponding to an opening portion of the cavity structure, which is to become the light outgoing surface 113 and (ii) forming the light reflecting wall 102*a* on a side wall of the metal plate 201 by carrying out wet etching with respect to the metal plate 201 with the mask member 211, the step (ii) including, in the middle of the wet etching, the mask member 211 being bent by press working along the light reflecting wall 102*a* formed by the wet etching.

According to the method, the mask member 211 has the opening mask portion corresponding to the opening portion of the cavity structure, and is formed on the front surface of the metal foil 201 on which back surface the laminated substrate 106 is laminated. Then, the wet etching is carried out with respect to the metal foil 201 with the mask member 211, thereby forming the light reflecting wall 102*a* to the side wall of the metal foil 201. After that, in the middle of the wet etching as illustrated in FIG. 8(*a*) or FIG. 8(*b*), the mask member 211 is bent by press working along the light reflecting wall 102*a* formed by the wet etching, as illustrated in FIG. 8(*c*).

With this arrangement, the wet etching is carried out with respect to the surface of the metal foil 201 while the rim of the opening portion of the metal foil 201 is protected with the mask member 211. Therefore, (i) it is possible to stably keep the shape and strength of the manufactured light reflecting metal plate 102 while the thickness between the outer circumferential wall and the light reflecting wall 102*a* on the cavity structure side is kept to a thickness of not less than a predetermined one and (ii) it is possible to secure the bottom width of the bottom part in the cavity structure of the light reflecting metal plate 102 while the opening width of the opening portion is suppressed.

For example, in a case of using a conventional LED chip whose width is 240 μm and having no mask member 211 press worked, a short side packaged width of a copper wall having a height of not less than 250 μm can not be miniaturized less than 800 μm.

On the other hand, in a case where the mask member 211 is press worked with the method for manufacturing the light reflecting wall 102*a* of the light reflecting metal plate 102, with the copper wall at the same height of not less than 250 μm as described above, it became possible to miniaturize the short side packaged width up to 600 μm. Further, with the aforementioned method for manufacturing, in a case where the short side packaged width is set to 800 μm, it became possible to form the copper wall higher than 300 μm.

Moreover, in the method for manufacturing the light reflecting wall 102*a* of the light reflecting metal plate 102 of the light-emitting element 100 in accordance with the present embodiment, the wet etching first is carried out with respect to the metal foil 201, and then the wet etching and the press working are alternately carried out until the surface layer 103 of the laminated substrate 106 is exposed, so that the light reflecting wall 102*a* of the light reflecting metal plate 102 is formed.

As a result, in a case where, after being press worked, the mask member 211 turns up again in the wet etching, it becomes possible to surely protect the rim of the opening portion of the cavity structure with the mask member 211, by performing the press working again.

Second Step for Manufacturing in the Present Embodiment

The following describes another method for manufacturing a light-emitting element 100 in accordance with the present embodiment.

Figure 9A:
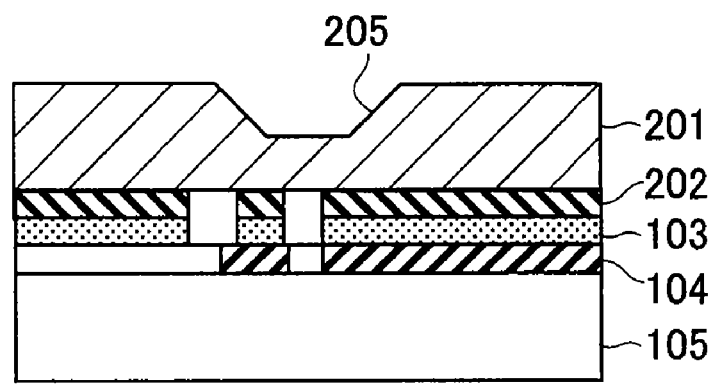
FIGS. 9(a) and 9(b) are flow sheets, each of which illustrates another step for manufacturing the light reflecting metal wall of the light-emitting element.
Figure 9A:
Figure 9B:
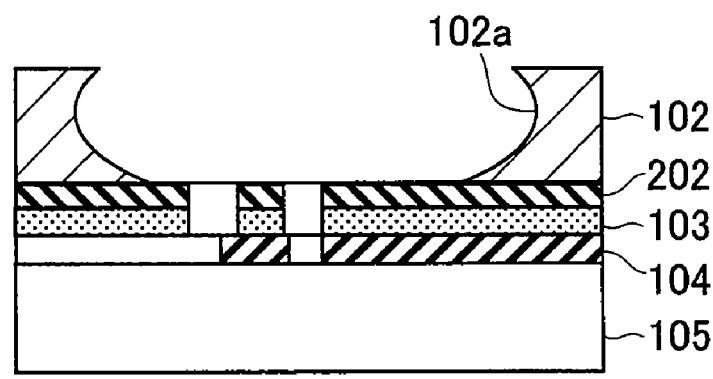
Figure 10A:
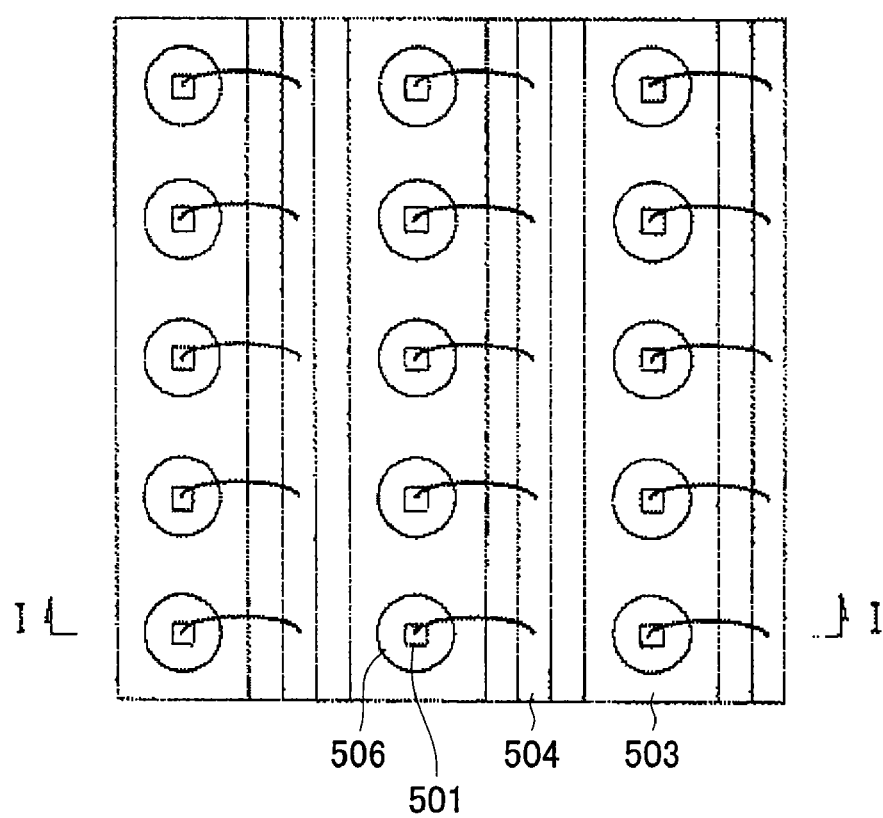
FIG. 10(a) is a top view illustrating an arrangement of a conventional light-emitting element.
Figure 10B:
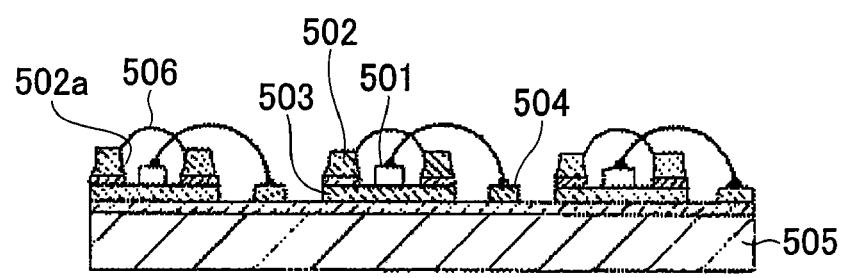
FIG. 10(b) is a side cross-section view illustrating the conventional light-emitting element.
Figure 11A:
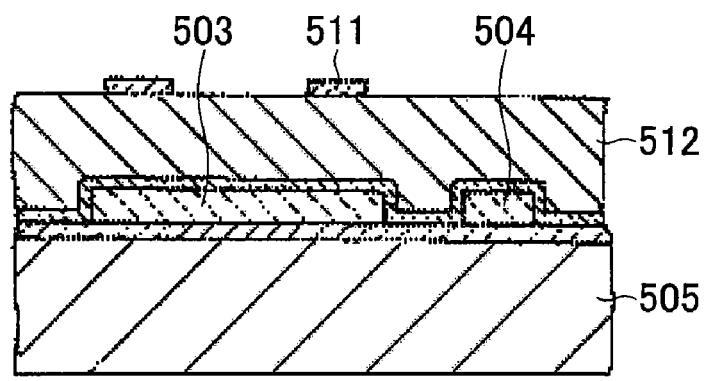
FIGS. 11(a) and 11(b) are flow sheets, each of which illustrates a step for manufacturing the light reflecting metal wall of the conventional light-emitting element.
Figure 11B:
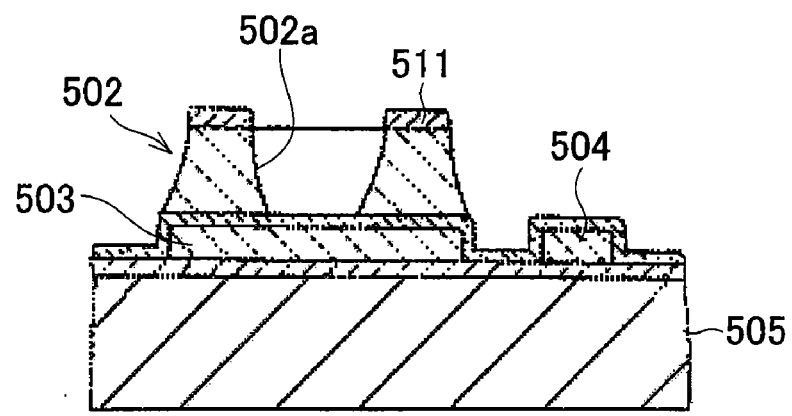
Figure 12:
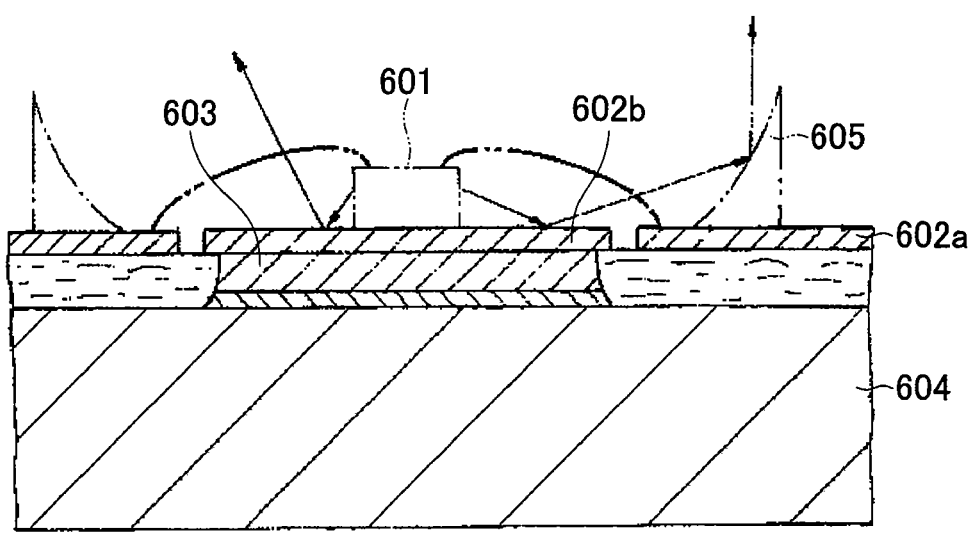
FIG. 12 is a side cross-section view illustrating an arrangement of the conventional light-emitting element.
Figure 13A:
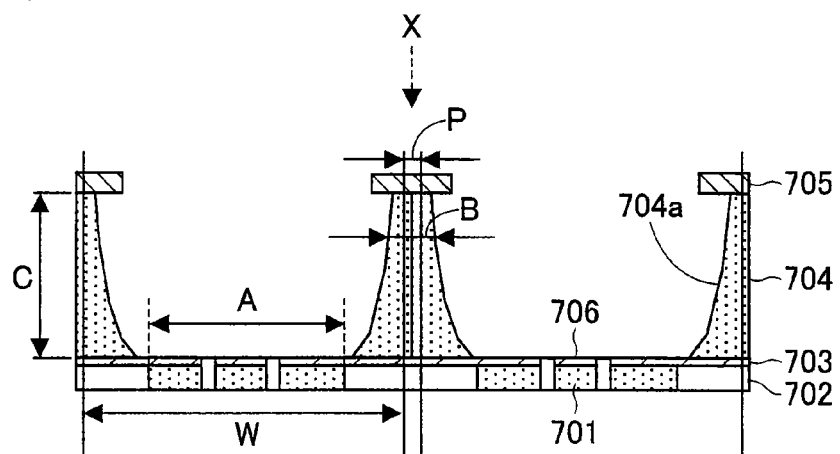
FIG. 13(a) is a side cross-section view illustrating an arrangement of the conventional light-emitting element.
Figure 13B:
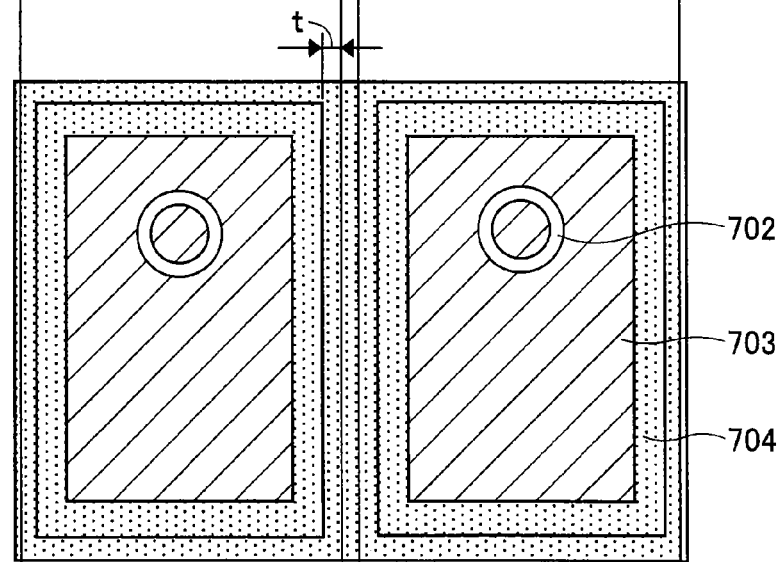
FIG. 13(b) is a top view illustrating the conventional light-emitting element having no mask member.
Figure 13C:
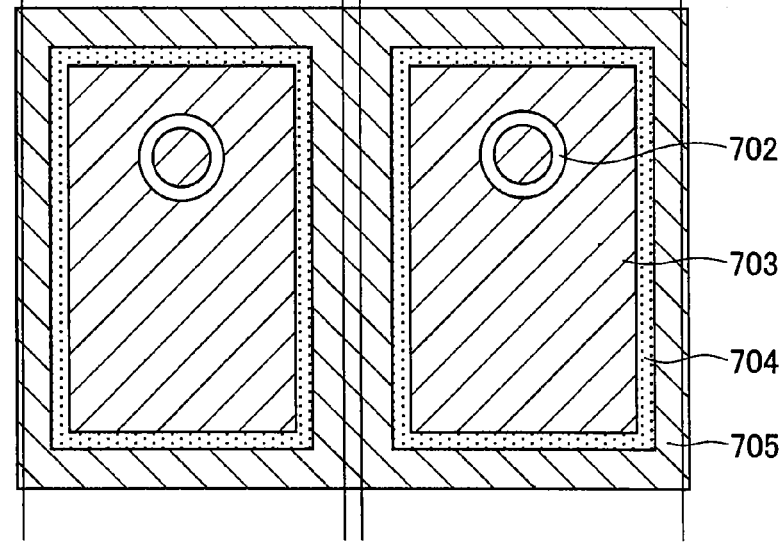
FIG. 13(c) is a top view illustrating the conventional light-emitting element having the mask member.
Figure 14A:
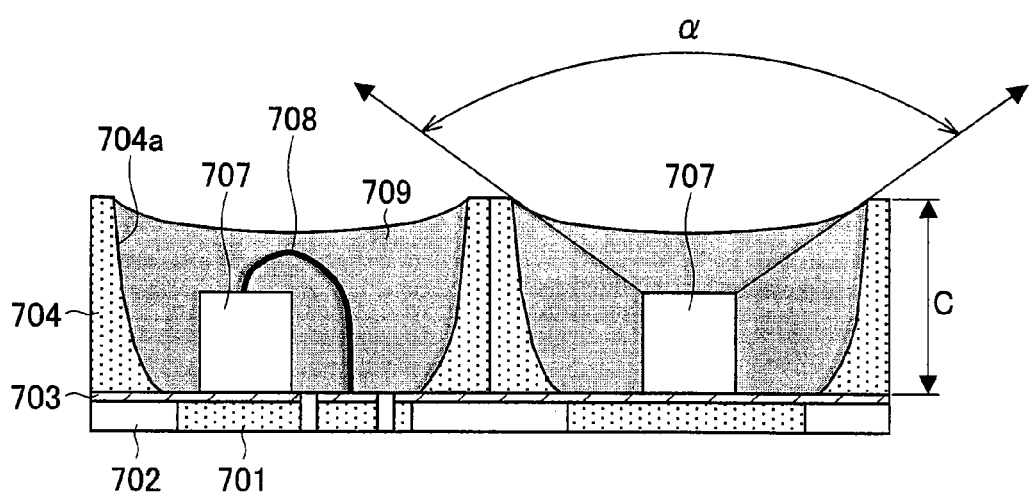
FIG. 14(a) is a side cross-section view illustrating an arrangement of the conventional light-emitting element, wherein the light reflecting metal wall has a low height.
Figure 14B:
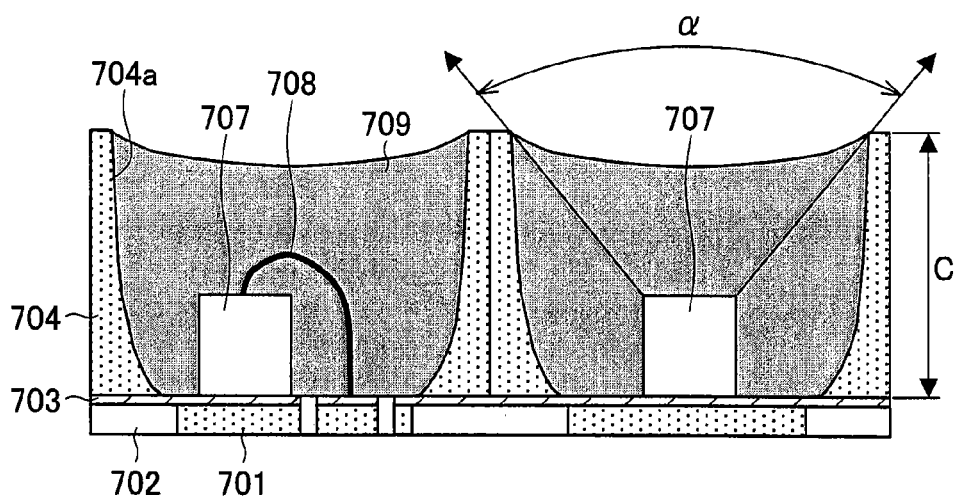
FIG. 14(b) is a side cross-section view illustrating an arrangement of the conventional light-emitting element, wherein the light reflecting metal wall has a high height.

FIG. 9(*a*) illustrates a state of a light reflecting metal plate 102, where a light reflecting wall 102*a* has not been formed yet, and FIG. 9(*b*) illustrates a state of the light reflecting metal plate, where the light reflecting wall 102*a* has been already formed. Note that the light-emitting element 100 is not manufactured individually, instead, a plurality of light-emitting elements are disposed at a prescribed interval and simultaneously manufactured in a single metal plate. However, FIGS. 9(*a*) and 9(*b*) illustrate only a single light-emitting element for convenience.

In order to achieve more controllability of a hem shape of the light reflecting wall 102*a* of the light reflecting metal plate 102, the following manufacturing method may be adopted. That is to say, as illustrated in FIG. 9(*a*), metal foil 201 having a concave portion 205 is adopted, the concave portion 205 being formed in advance by press working in accordance with an etching area of the metal foil 201.

Figure 3B:
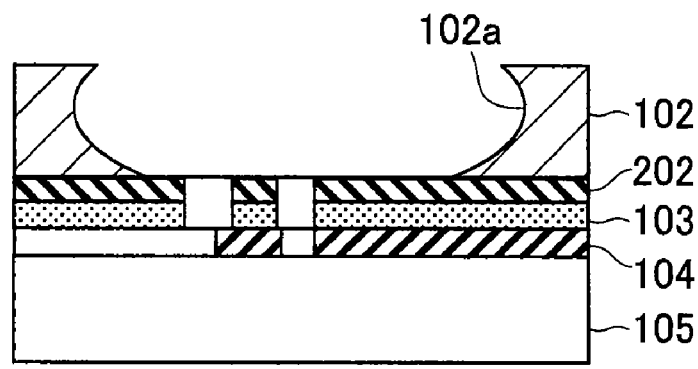

And then, with the same step as described above with reference to FIGS. 3(*a*) to 3(*b*), as illustrated in FIG. 9(*b*), an inner space, which is a cavity structure, is formed, the inner space being surrounded with the light reflecting wall 102*a* of the light reflecting metal plate 102 and a surface layer 103 (the nickel plating 202) of a laminated substrate 106. Moreover, each step illustrated in FIGS. 4(*a*) to 4(*g*) should be performed as well, and each step illustrated in FIGS. 5(*a*) to 5(*d*) may be performed arbitrarily.

In the second step for manufacturing in the present embodiment, the concave portion 205 is formed in the metal foil 201 before the wet etching is performed. This allows a reduction in etching amount. Therefore, it is possible to achieve more controllability of the cross sectional shape of the light reflecting metal plate 102, and also to narrow a hem of the cross sectional shape of the light reflecting metal plate 102. Further, since it is possible to make thinner a width of the light-emitting element 100, it is possible to make further thinner a backlight of a liquid crystal display panel having the light-emitting element in accordance with the present embodiment.

The present invention is not limited to the description of the embodiment above, but may be altered by a skilled person within the scope of the claims. An embodiment based on a proper combination of technical means disclosed in different embodiments is encompassed in the technical scope of the present invention.

The present invention is applicable to a method for manufacturing a light-emitting element suitable for irradiating a thin display body, such as a liquid crystal display panel, from a side of the display body. However, the present invention is not limited to this but applicable to other fields.

As described above, a method for manufacturing a light reflecting metal wall in accordance with the present invention, includes the step of (a) forming a cavity structure on a metal plate on which back surface a substrate is laminated, the cavity structure including on its side wall a light reflecting wall, the step (a) including the steps of (b) forming a first mask on a surface of the metal plate, the first mask having a mask opening portion corresponding to an opening portion of the cavity structure and (c) forming the light reflecting wall on a side wall of the metal plate by carrying out wet etching with respect to the metal plate with the first mask, in the step (c), in the middle of the wet etching, the first mask being bent by press working along the light reflecting wall formed by the wet etching.

With the method, the wet etching is carried out with respect to the surface of the metal plate while a rim of the opening portion of the metal plate is protected with the first mask. Therefore, (i) it becomes possible to stably keep the shape and strength of the manufactured metal plate while the thickness between the outer circumferential wall and the light reflecting wall on the cavity structure side is kept to a thickness of not less than a predetermined one and (ii) it becomes possible to secure the bottom width of the bottom part in the cavity structure of the metal plate while the opening width of the opening portion is suppressed.

As such, the cavity structure is stably formed by securing both (i) the area at the bottom of the cavity structure of the metal plate and (ii) the thickness of the metal plate even if a packaged light-emitting element has a narrow lateral width of its short side. And, with this etching method, the light reflecting wall is arranged such that the opening portion is made smaller than the center part, thereby preventing a material (such as a resin material), which fills the cavity structure of the metal plate, from coming off.

Further, in the method of the present invention, it is preferable that, in the step (c), the wet etching first is carried out, and then the wet etching and the press working are alternately carried out until the substrate is exposed.

According to the arrangement, the wet etching is performed first, and then the wet etching and the press working are performed alternately until the substrate laminated on the backside of the metal plate is exposed. As such, a second press working allows the rim of the opening portion of the cavity structure to be protect by the first mask, even when the first mask turns up in the wet etching after a first press working is carried out.

Furthermore, in the method of the present invention, it is preferable that the press working is a process for pushing an elastic body into the first mask.

With the arrangement, the elastic body is pressed into the first mask having the opening mask portion so as to enter the mask opening portion further by changing its shape along the light reflecting wall formed by wet etching. At this point, the elastic body is pressed until it completely touches the light reflecting wall, so that the first mask between the elastic body and the light reflecting wall is bended along the light reflecting wall. This makes it possible to easily bend the first mask along the light reflecting wall.

Moreover, in the method of the present invention, the elastic body is preferably made of rubber.

Further, in the method of the present invention, it is preferable that the first mask has such a thickness as to be bent in a plastic deformation under the pressure which does not cause the substrate laminated on the back surface of the metal plate to be damaged by the press working in the step (c).

With the method, the first mask has such a thickness as to be bent in a plastic deformation under the pressure which does not cause the substrate laminated on the back surface of the metal plate to be damaged by the press working. As such, in a case where the first mask formed on the front surface of the metal plate is bent by the press working along the light reflecting wall which is formed by the wet etching, it becomes possible to surely bend the first mask without any damage to the substrate.

Furthermore, in the method of the present invention, it is preferable that the first mask has such a thickness that allows a portion bent by the press working to be secured under water pressure in the wet etching in the step (c).

According to the arrangement, the first mask has such a thickness that allows a portion bent by the press working to be secured under water pressure in the wet etching. As such, in a case where the wet etching is performed after the first mask is bent by the press working, it becomes possible to prevent the first mask from turning up by the water pressure in the wet etching.

Moreover, in the method of the present invention, it is preferable that the mask opening portion has a quadrangular shape having slits at respective corners.

With the arrangement, the mask opening portion of the first mask has a quadrangular shape having slits at its corners, so that it becomes possible to bend the corners easily in carrying out the press working with respect to the first mask.

Further, in the method of the present invention, the step (a) preferably includes the steps of (d) after the step (c), causing the first mask to be exfoliated from the metal plate including the light reflecting wall, (e) performing a first metal plating with respect to a surface of the metal plate from which the first mask is exfoliated, to which surface the wet etching is carried out, (f) removing the first metal plating, formed on the bottom surface of the metal plate which bottom surface is surrounded with the light reflecting wall, so that a second mask is formed, and (g) carrying out wet etching with respect to the metal plate with the second mask.

According to the method, after the first mask is exfoliated from the substrate, the first metal plating is carried out with respect to the surface of the metal plate to which the wet etching has been carried out. Then, the first metal plating, formed on the bottom surface surrounded with the light reflecting wall, is removed, thereby forming the second mask. After that, the wet etching is carried out with respect to the metal plate with the second mask. This allows the light reflecting wall to be suitably formed with adjustments by alterations and additions.

Moreover, in the method of the present invention, it is preferable that the first metal plating is made of nickel, solder, gold, tin or lead.

Further, in the method of the present invention, it is preferable that the metal plate is made of copper.

According to the arrangement, the metal plate is made of copper, which has high light reflectivity in metal. This results in that the light reflecting metal wall manufactured with the method can have high light reflectivity.

Furthermore, in the method of the present invention, it is preferable that the first mask is made of nickel, solder, gold, tin or lead.

The embodiments and concrete examples of implementation discussed in the foregoing detailed explanation serve solely to illustrate the technical details of the present invention, which should not be narrowly interpreted within the limits of such embodiments and concrete examples, but rather may be applied in many variations within the spirit of the present invention, provided such variations do not exceed the scope of the patent claims set forth below.

What is claimed is:

1. A method for manufacturing a light reflecting metal wall, comprising the step of:
   (a) forming a cavity structure on a metal plate on which back surface a substrate is laminated, the cavity structure including on its side wall a light reflecting wall,
   the step (a) including the steps of:
      (b) forming a first mask on a surface of the metal plate, the first mask having a mask opening portion corresponding to an opening portion of the cavity structure; and
      (c) forming the light reflecting wall on a side wall of the metal plate by carrying out wet etching with respect to the metal plate with the first mask, in the step (c), in the middle of the wet etching, the first mask being bent by press working along the light reflecting wall formed by the wet etching.

2. The method according to claim 1, wherein:
   in the step (c), the wet etching first is carried out, and then the wet etching and the press working are alternately carried out until the substrate is exposed.

3. The method according to claim 1, wherein the mask opening portion has a quadrangular shape having slits at respective corners.

4. The method according to claim 1, wherein the metal plate is made of copper.

5. The method according to claim 1, wherein the first mask is made of nickel, solder, gold, tin or lead.

6. The method according to claim 1, wherein the press working is a process for pushing an elastic body into the first mask.

7. The method according to claim 6, wherein a rubber is used as the elastic body.

8. The method according to claim 1, wherein the first mask has such a thickness as to be bent in a plastic deformation under the pressure which does not cause the substrate laminated on the back surface of the metal plate to be damaged by the press working in the step (c).

9. The method according to claim 8, wherein the thickness allows a portion bent by the press working to be secured under water pressure in the wet etching in the step (c).

10. The method according to claim 1, wherein the step (a) includes:
    (d) after the step (c), causing the first mask to be exfoliated from the metal plate including the light reflecting wall;
    (e) performing a first metal plating with respect to a surface of the metal plate from which the first mask is exfoliated, to which surface the wet etching is carried out;
    (f) removing the first metal plating, formed on the bottom surface of the metal plate which bottom surface is surrounded with the light reflecting wall, so that a second mask is formed; and
    (g) carrying out wet etching with respect to the metal plate with the second mask.

11. The method according to claim 10, wherein the first metal plating is made of nickel, solder, gold, tin or lead.

* * * * *